(12) United States Patent
Manea

(10) Patent No.: US 11,482,281 B2
(45) Date of Patent: Oct. 25, 2022

(54) VOLTAGE-MODE BIT LINE PRECHARGE FOR RANDOM-ACCESS MEMORY CELLS

(71) Applicant: HEFEI RELIANCE MEMORY LIMITED, Hefei (CN)

(72) Inventor: Danut Manea, Saratoga, CA (US)

(73) Assignee: Hefei Reliance Memory Limited, Hefei (CN)

( * ) Notice: Subject to any disclaimer, the term of this patent is extended or adjusted under 35 U.S.C. 154(b) by 0 days.

(21) Appl. No.: 17/244,507

(22) Filed: Apr. 29, 2021

(65) Prior Publication Data

US 2021/0295911 A1    Sep. 23, 2021

Related U.S. Application Data

(63) Continuation of application No. 16/670,633, filed on Oct. 31, 2019, now Pat. No. 11,024,373.

(60) Provisional application No. 62/899,211, filed on Sep. 12, 2019.

(51) Int. Cl.
  G11C 11/00     (2006.01)
  G11C 13/00     (2006.01)

(52) U.S. Cl.
  CPC ........ G11C 13/0026 (2013.01); G11C 13/003 (2013.01); G11C 13/004 (2013.01); G11C 13/0038 (2013.01); *G11C 2213/79* (2013.01)

(58) Field of Classification Search
  CPC .............. G11C 13/0026; G11C 13/003; G11C 13/0038; G11C 13/004
  USPC ....................................................... 365/148
  See application file for complete search history.

(56) References Cited

U.S. PATENT DOCUMENTS

| | | | |
|---|---|---|---|
| 3,747,008 A | 7/1973 | Zaretsky | |
| 4,634,894 A | 1/1987 | Shu et al. | |
| 4,899,317 A | 2/1990 | Hoekstra et al. | |
| 5,828,614 A | 10/1998 | Gradinariu | |
| 5,914,681 A * | 6/1999 | Rundel ................. | H03M 1/002 341/135 |
| 7,529,130 B2 | 5/2009 | Toda | |
| 9,153,321 B2 | 10/2015 | Haukness | |
| 9,269,428 B2 | 2/2016 | Ryu | |
| 2002/0024379 A1 | 2/2002 | Savelli | |
| 2004/0223354 A1 | 11/2004 | Lee | |
| 2008/0001251 A1* | 1/2008 | Anand ................... | G11C 17/18 257/529 |
| 2014/0104926 A1 | 4/2014 | Sutardja et al. | |

(Continued)

OTHER PUBLICATIONS

PCT International Search Report and the Written Opinion dated Dec. 7, 2020, issued in related International Application No. PCT/US2020/050544 (11 pages).

(Continued)

*Primary Examiner* — Vu A Le
(74) *Attorney, Agent, or Firm* — Sheppard Mullin Richter & Hampton LLP

(57) ABSTRACT

Circuits and methods are disclosed for voltage-mode bit line precharge for random-access memory cells. A circuit includes an array of random access memory cells; a low-impedance voltage source configured to provide a precharge voltage; and a control circuit configured to precharge a bit line of one of the random access memory cells to the precharge voltage using the low-impedance voltage source prior to reading the one of the random access memory cells.

20 Claims, 10 Drawing Sheets

(56) References Cited

U.S. PATENT DOCUMENTS

2014/0169069 A1   6/2014   Oh

OTHER PUBLICATIONS

Non-Final Office Action dated Nov. 12, 2020, issued in related U.S. Appl. No. 16/670,633 (7 pages).

* cited by examiner

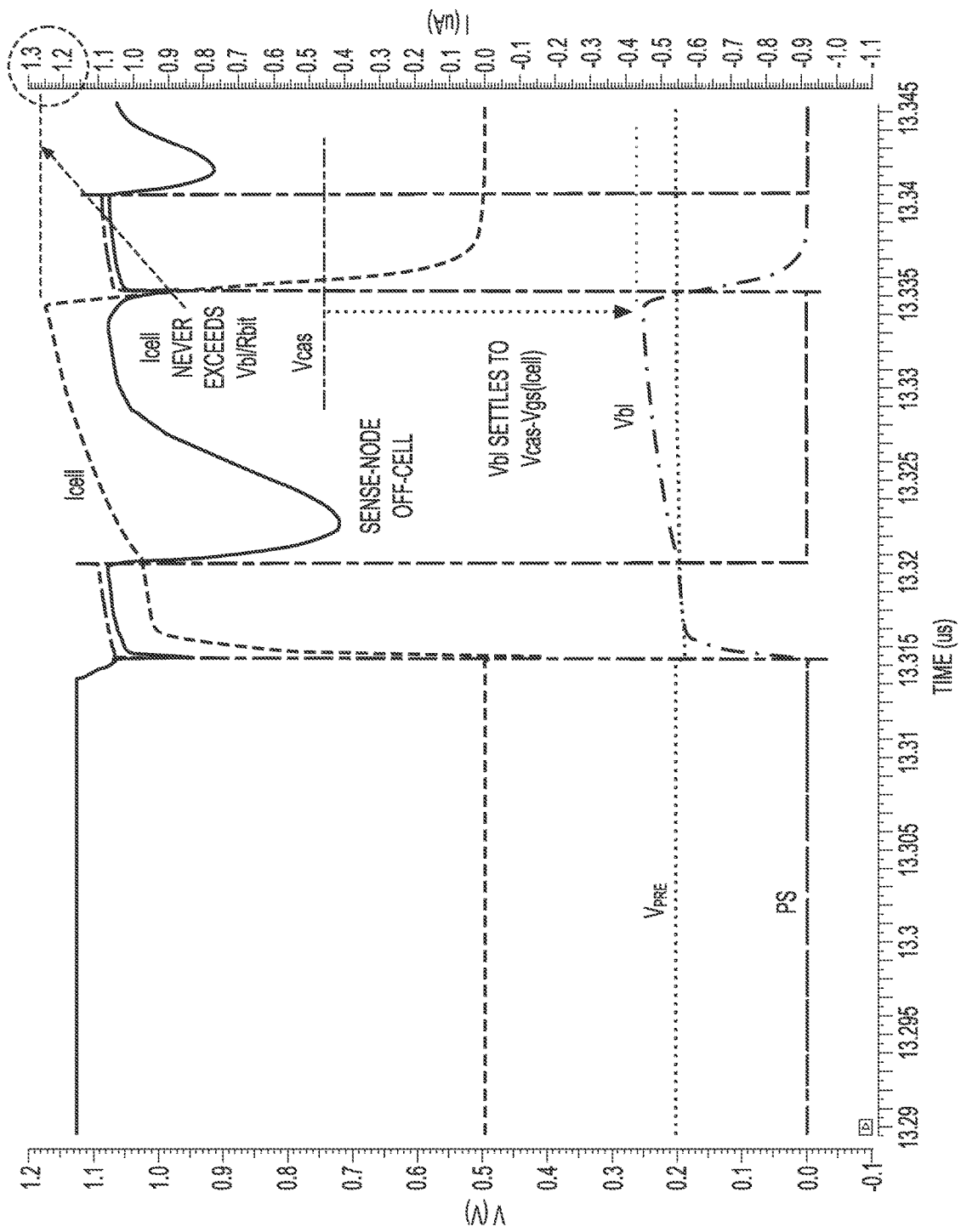

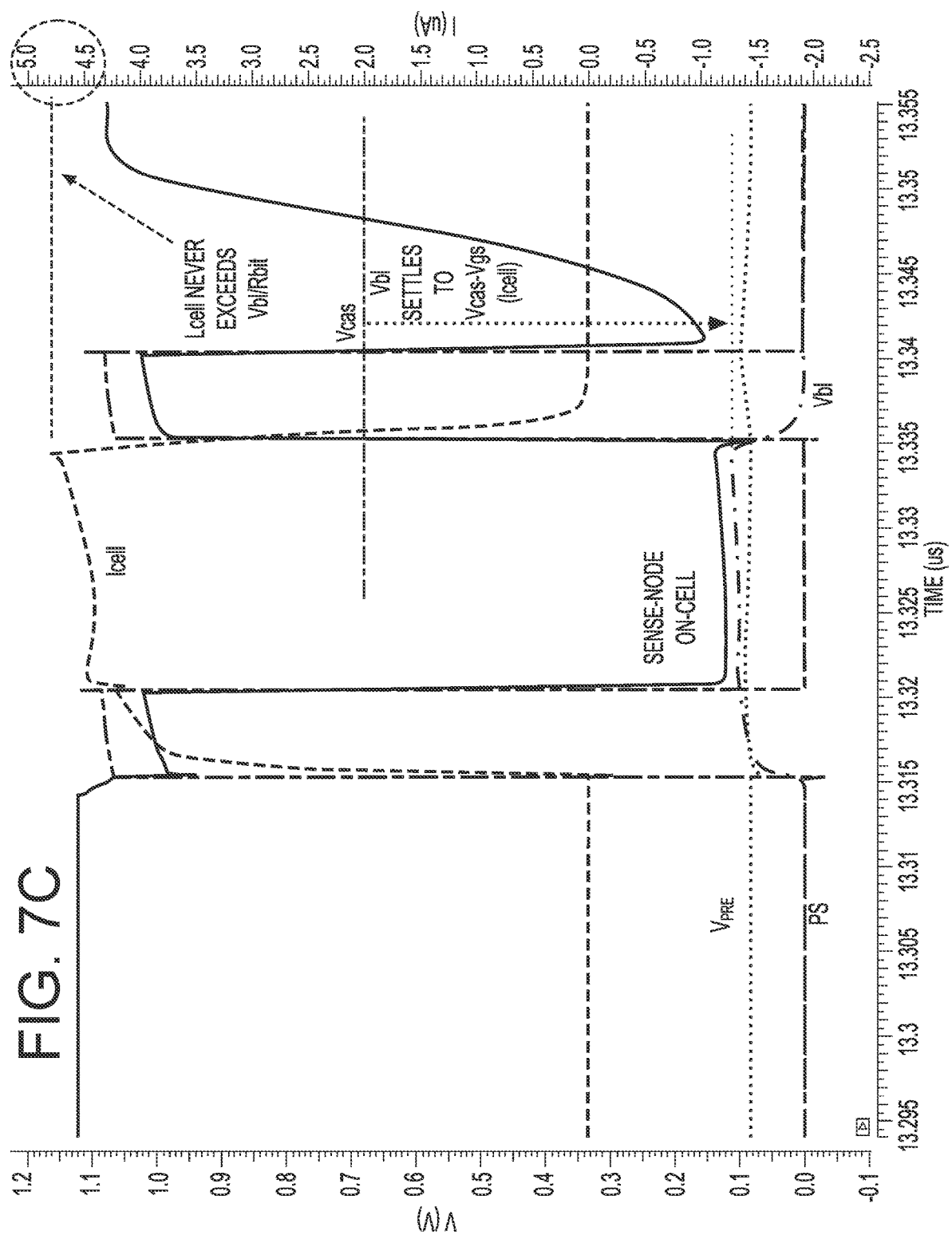

VOLTAGE-MODE BIT LINE PRECHARGE FOR RANDOM-ACCESS MEMORY CELLS

CROSS REFERENCE TO RELATED APPLICATIONS

The present application is a continuation of U.S. patent application Ser. No. 16/670,633, filed Oct. 31, 2019, entitled "VOLTAGE-MODE BIT LINE PRECHARGE FOR RANDOM-ACCESS MEMORY CELLS", which claims priority to U.S. Provisional Patent Application No. 62/899,211, filed Sep. 12, 2019, entitled "VOLTAGE-MODE PRE-CHARGE SCHEME FOR RRAM SENSE-AMP". U.S. patent application Ser. No. 16/670,633 is related to International Application No. PCT/US2020/050544, filed Sep. 11, 2020, entitled "VOLTAGE-MODE BIT LINE PRECHARGE FOR RANDOM-ACCESS MEMORY CELLS". All of the above-referenced applications are incorporated by reference herein in their entirety.

TECHNICAL FIELD

This disclosure relates to generally to memory cells, and more specifically to precharging random-access memory cells.

In general, one aspect disclosed features a memory circuit comprising: an array of random access memory cells; a low-impedance voltage source configured to provide a precharge voltage; and a control circuit configured to precharge a bit line of one of the random access memory cells to the precharge voltage using the low-impedance voltage source prior to reading the one of the random access memory cells.

Embodiments of the method may include one or more of the following features. Some embodiments comprise a on/off switch disposed between the low-impedance voltage source and the bit line of the one of the random access memory cells; wherein the control circuit is configured to electrically couple the low-impedance voltage source to the bit line until the bit line reaches the precharge voltage, and to electrically decouple the low-impedance voltage source from the bit line prior to reading the one of the random access memory cells. In some embodiments, the low-impedance voltage source is a high-gain feedback loop low-impedance voltage source. In some embodiments, the low-impedance voltage source comprises a unity-gain amplifier. In some embodiments, the random access memory cells are resistive random access memory cells. In some embodiments, a magnitude of the precharge voltage is selected such that a read time of the memory cells when off is approximately equal to a read time of the memory cells when on. In some embodiments, each of the resistive random access memory cells comprises: a three-terminal access element; and a resistive memory element coupled between the three-terminal access element and one of a plurality of the bit lines. In some embodiments, a first terminal of the three-terminal access element is coupled to one of a plurality of word lines; a second terminal of the three-terminal access element is coupled to one of a plurality of source lines; and the resistive memory element is coupled between a third terminal of the three-terminal access element and the one of the plurality of the bit lines. Some embodiments comprise a sense amplifier configured to read the random access memory cells.

In general, one aspect disclosed features a method for reading a random access memory cell, the method comprising: providing a precharge voltage from a low-impedance voltage source to a bit line of the random access memory cell; and reading the memory cell subsequent to a voltage of the bit line reaching the precharge voltage. Some embodiments comprise ceasing to provide the precharge voltage from the low-impedance voltage source to the bit line of the random access memory cell prior to reading the memory cell. Some embodiments comprise electrically coupling the low-impedance voltage source to the bit line until the bit line reaches the precharge voltage; and electrically decoupling the low-impedance voltage source from the bit line prior to reading the random access memory cell. In some embodiments, the voltage source comprises a low-impedance voltage source. In some embodiments, the low-impedance voltage source comprises a unity-gain amplifier. In some embodiments, the random access memory cell is a resistive random access memory cell. In some embodiments, a magnitude of the precharge voltage is selected such that a read time of the memory cells when off is approximately equal to a read time of the memory cells when on. In some embodiments, the resistive random access memory cell comprises: a three-terminal access element; and a resistive memory element coupled between the three-terminal access element and the bit line. Some embodiments comprise a first terminal of the three-terminal access element is coupled to a word line; a second terminal of the three-terminal access element is coupled to a source line; and the resistive memory element is coupled between a third terminal of the three-terminal access element and the bit line.

BACKGROUND

Pre-charging a random-access memory (RAM) cell is a common technique to reduce the time required to read the state of the RAM cell. According to this technique, a large current is applied to the RAM cell to quickly bring the voltage of the RAM cell to a desired value prior to reading the state of the RAM cell. Without pre-charging, the RAM cell is charged relatively slowly by a small reference current.

SUMMARY

Circuits and methods are disclosed for voltage-mode bit line precharge for random-access memory cells.

In general, one aspect disclosed features a memory circuit comprising: an array of random access memory cells; a low-impedance voltage source configured to provide a precharge voltage; and a control circuit configured to precharge a bit line of one of the random access memory cells to the precharge voltage using the low-impedance voltage source prior to reading the one of the random access memory cells.

Embodiments of the memory circuit may include one or more of the following features. Some embodiments comprise a on/off switch disposed between the low-impedance voltage source and the bit line of the one of the random access memory cells; wherein the control circuit is configured to electrically couple the low-impedance voltage source to the bit line until the bit line reaches the precharge voltage, and to electrically decouple the low-impedance voltage source from the bit line prior to reading the one of the random access memory cells. In some embodiments, the low-impedance voltage source is a high-gain low-impedance voltage source. In some embodiments, the low-impedance voltage source comprises a unity-gain amplifier. In some embodiments, the random access memory cells are resistive random access memory cells. In some embodiments, a magnitude of the precharge voltage is selected such that a read time of the memory cells when off is approximately equal to a read time of the memory cells when on. In some embodiments, each of the resistive random access memory cells comprises: a three-terminal access element; and a resistive memory element coupled between the three-terminal access element and one of a plurality of the bit lines. In some embodiments, a first terminal of the three-terminal access element is coupled to one of a plurality of word lines; a second terminal of the three-terminal access element is coupled to one of a plurality of source lines; and the resistive memory element is coupled between a third terminal of the three-terminal access element and the one of the plurality of the bit lines. Some embodiments comprise a sense amplifier configured to read the random access memory cells.

In general, one aspect disclosed features a method for reading a random access memory cell, the method comprising: providing a precharge voltage from a low-impedance voltage source to a bit line of the random access memory cell; and reading the memory cell subsequent to a voltage of the bit line reaching the precharge voltage.

Embodiments of the method may include one or more of the following features. Some embodiments comprise ceasing to provide the precharge voltage from the low-impedance voltage source to the bit line of the random access memory cell prior to reading the memory cell. Some embodiments comprise electrically coupling the low-impedance voltage source to the bit line until the bit line reaches the precharge voltage; and electrically decoupling the low-impedance voltage source from the bit line prior to reading the random access memory cell. In some embodiments, the voltage source comprises a low-impedance voltage source. In some embodiments, the low-impedance voltage source comprises a unity-gain amplifier. In some embodiments, the random access memory cell is a resistive random access memory cell. In some embodiments, a magnitude of the precharge voltage is selected such that a read time of the memory cells when off is approximately equal to a read time of the memory cells when on. In some embodiments, the resistive random access memory cell comprises: a three-terminal access element; and a resistive memory element coupled between the three-terminal access element and the bit line. In some embodiments, a first terminal of the three-terminal access element is coupled to a word line; a second terminal of the three-terminal access element is coupled to a source line; and the resistive memory element is coupled between a third terminal of the three-terminal access element and the bit line.

BRIEF DESCRIPTION OF THE DRAWINGS

FIG. 7A illustrates a read operation for a RRAM cell having a resistive memory element in the off state using a precharge voltage of VPRE=200 mV.

FIG. 7C illustrates a read operation for a RRAM cell having a resistive memory element in the off state using a precharge voltage of VPRE=80 mV.

DETAILED DESCRIPTION

Embodiments of the described technology provide voltage-mode bit line precharge for random-access memory cells. The described technology provides several significant advantages compared with conventional precharging approaches, as described in detail below.

Figure 1:
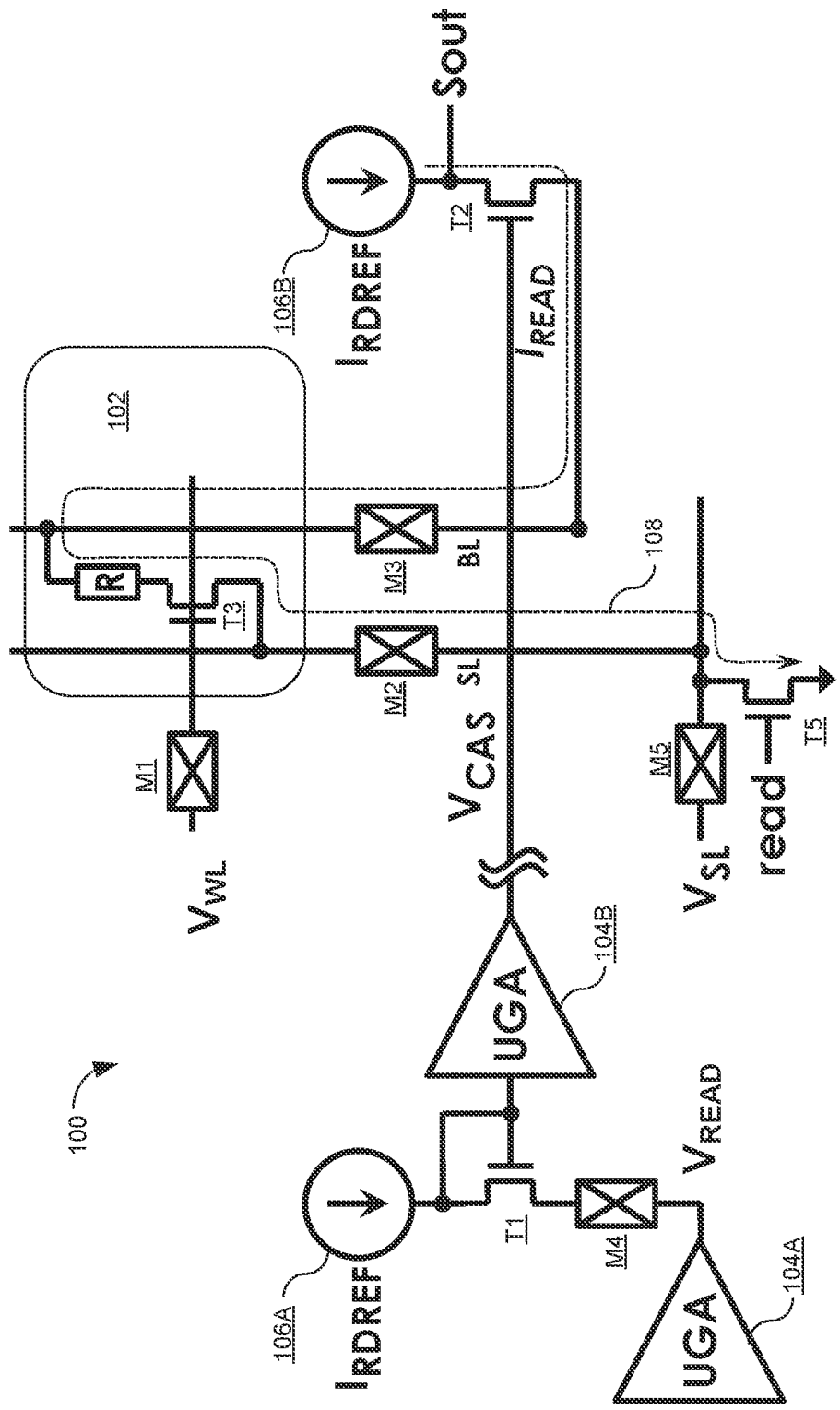
FIG. 1 illustrates a conventional memory circuit without pre-charging.

FIG. 1 illustrates a conventional memory circuit 100 without pre-charging. Referring to FIG. 1, the memory circuit 100 includes a RAM cell 102. The memory circuit 100 may include an array of RAM cells. However, for conciseness of description, only one RAM cell 102 is shown in FIG. 1. In the described embodiments, the RAM cells 102 are resistive RAM (RRAM) cells. However, the disclosed technology may be applied to any RAM cells.

The RRAM cell 102 includes a resistive memory element R and a transistor T3.

The transistor T3 serves as an access element for the resistive memory element R. The drain terminal of transistor T3 is coupled to a source line, which is coupled to a on/off switch M2. The gate of transistor T3 is coupled to a word line, which is coupled to a on/off switch M1. The source terminal of transistor T3 is coupled to one terminal of the resistive memory element R. The other terminal of the resistive memory element R is coupled to a bit line, which is coupled to a on/off switch M3. A control circuit (not shown) provides access to the RRAM cell 102 by manipulating the on/off switches M1, M2, and M3.

The bit line of the RRAM cell 102 is pre-charged by a reference current source 106B. The reference current source 106B provides a reference current $I_{RDREF}$. The read current $I_{READ}$ is determined by the reference current $I_{RDREF}$ and the state of the resistive memory element R. The precharge voltage level $V_{READ}$ is set by a bias circuit. The bias circuit includes a current source 106A, a transistor T1, and two unity gain amplifiers (UGA) 104A and 104B. UGA 104A provides the precharge voltage level $V_{READ}$, which is stepped up by the gate-source voltage of a transistor T1. The stepped-up voltage is output by UGA 104B as voltage $V_{CAS}$. The voltage $V_{CAS}$ is stepped down by the gate-source voltage of transistor T2 to the precharge voltage level $V_{READ}$.

The path of the read current $I_{READ}$ is illustrated by a broken line, at 108. As shown in FIG. 1, the read current $I_{READ}$ flows through the memory cell and a transistor T5 to ground. The voltage level at a sense output Sout varies with the state of the resistive memory element R, and therefore indicates that state. The state of the resistive memory element R may be read at sense output Sout by a sense amplifier (not shown).

Thus in the memory circuit 100 of FIG. 1, the bit line of the RRAM cell 102 is charged only by the read current $I_{READ}$. This recurrent may be very small for RRAM technologies, for example at a level of approximately 5 microamps. With such a small current, significant time is consumed in charging the bit line of the RRAM cell 102 to the proper level for a read operation.

Figure 2:
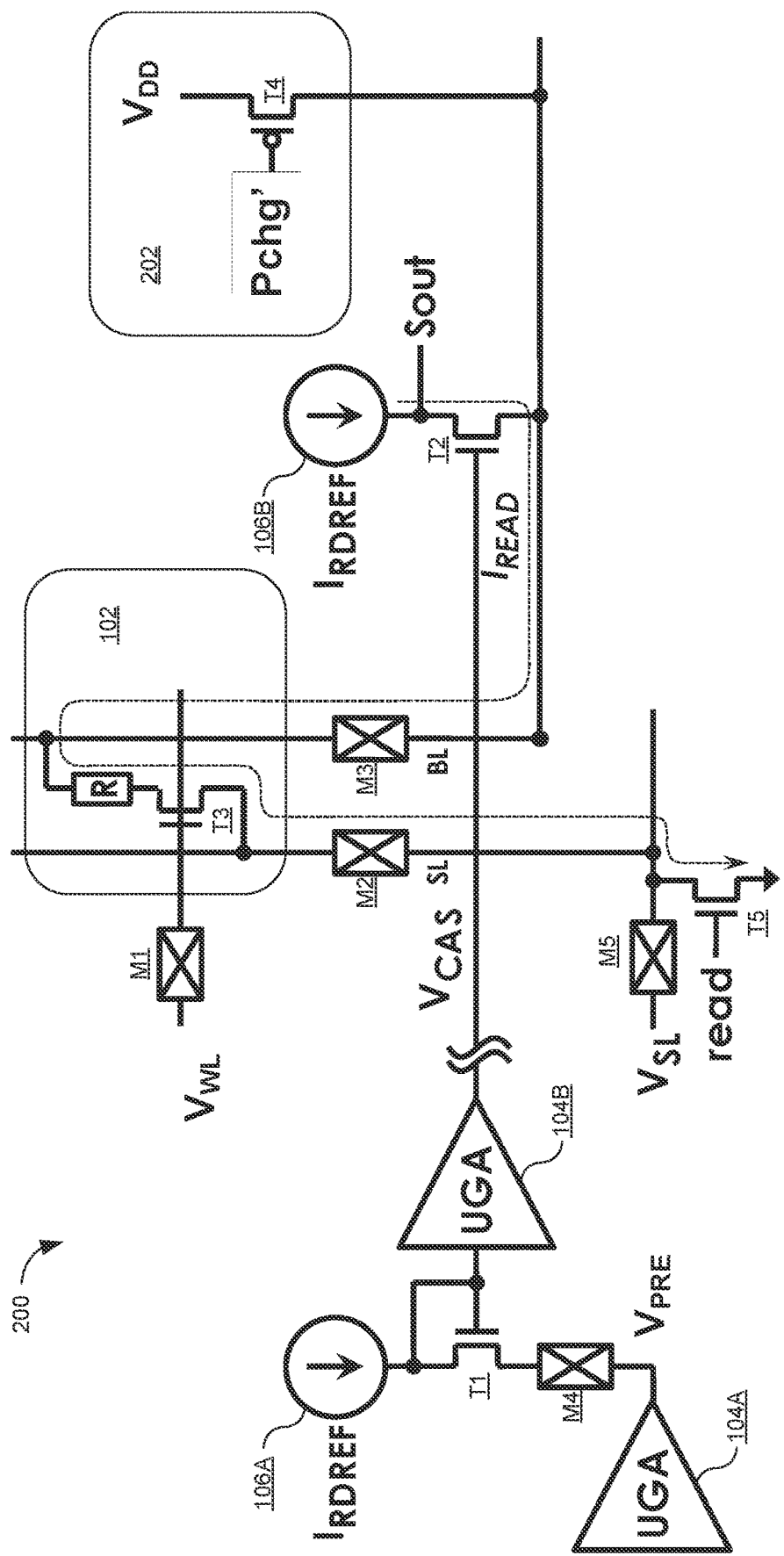
FIG. 2 illustrates a conventional memory circuit with current-mode memory cell pre-charging.

To reduce the time required for a read operation, the RRAM cell may be pre-charged. FIG. 2 illustrates a conventional memory circuit 200 with current-mode memory cell pre-charging. The memory circuit 200 of FIG. 2 is similar to the memory circuit 100 of FIG. 1, but with the addition of a precharge circuit 202. The other elements of the memory circuit 200 of FIG. 2 may be the same as in FIG. 1, and their descriptions are not repeated here.

The precharge circuit 202 includes a transistor T4. The transistor T4 may be a PMOS transistor, as shown in FIG. 2. A control circuit (not shown) provides a precharge signal Pchg' to a gate of the transistor T4. When enabled by the precharge signal, the transistor T4 acts as a current source that provides a large current to the bit line of the RRAM cell 102. This large current quickly pre-charges the bit line, thereby reducing read time for the RRAM cell 102. However, this approach has several disadvantages.

Figure 3:
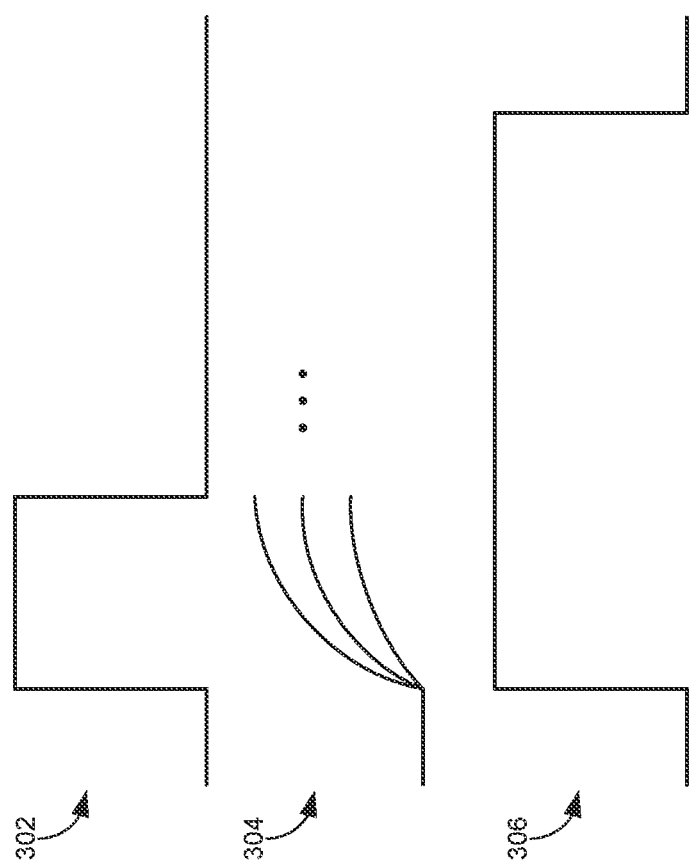
FIG. 3 illustrates a read operation for the memory circuit of FIG. 2.

FIG. 3 illustrates a read operation for the memory circuit 200 of FIG. 2. Referring to FIG. 3, the precharge signal is illustrated at 302. For ease of understanding, the precharge signal is shown inverted. The bit line voltage is illustrated at 304. A read signal is illustrated at 306. The control signal may operate the on/off switches M1-M5 to access the RRAM cell 102.

When the precharge signal is asserted, the bit line voltage begins to rise, as shown at 304. But as mentioned previously, the read current $I_{READ}$ is determined in part by the state of the resistive memory element R. And process variations in the resistive memory element R may cause this current to vary significantly among the resistive memory elements R in a memory array. Therefore, the precharge voltage speeds and levels at the bit line may vary significantly, as illustrated by the multiple curves in FIG. 3, at 304.

These variations result in two significant disadvantages. In some cases, the precharge voltage may overshoot, causing damage to the resistive memory element R. As a result, the resistive memory element may not retain its state as desired. In addition, this overshoot requires additional time to settle to the desired precharge voltage. As a result, the read time of the RRAM cell 102 is increased, causing slower operation of the memory array.

Figure 4:
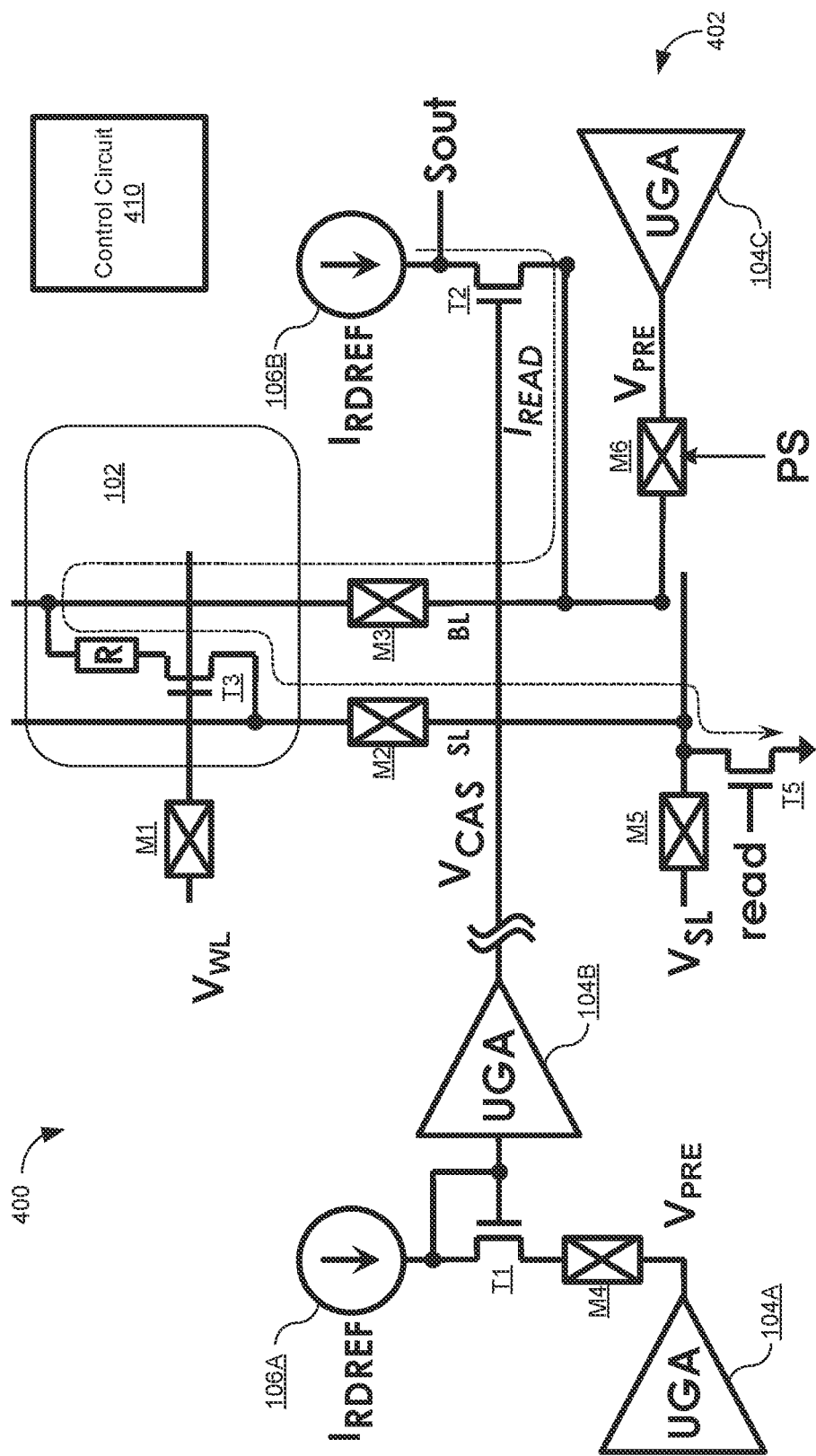
FIG. 4 illustrates a memory circuit according to some embodiments of the disclosed technology.

These problems are remedied by embodiments of the disclosed technology. Instead of current-mode pre-charging, these embodiments provide voltage-mode pre-charging. FIG. 4 illustrates a memory circuit 400 according to some embodiments of the disclosed technology. The memory circuit 400 of FIG. 4 may be similar to the memory circuit 100 of FIG. 1, but with the addition of a voltage-mode precharge circuit 402, and a control circuit 410. The other elements of the memory circuit 100 of FIG. 1 may be the same as in FIG. 1, and their descriptions are not repeated here.

The voltage-mode precharge circuit 402 of FIG. 4 may be implemented as a low-impedance voltage source. The low-impedance voltage source may be implemented with a high gain feedback loop to mitigate the effects of process variations in the resistive memory element R. In example of FIG. 4, the voltage source is implemented as a UGA 104C. The UGAs 104A and 104C each provide a precharge voltage $V_{PRE}$. In some embodiments, the UGAs 104A and 104C may be implemented as a single UGA.

Figure 5:
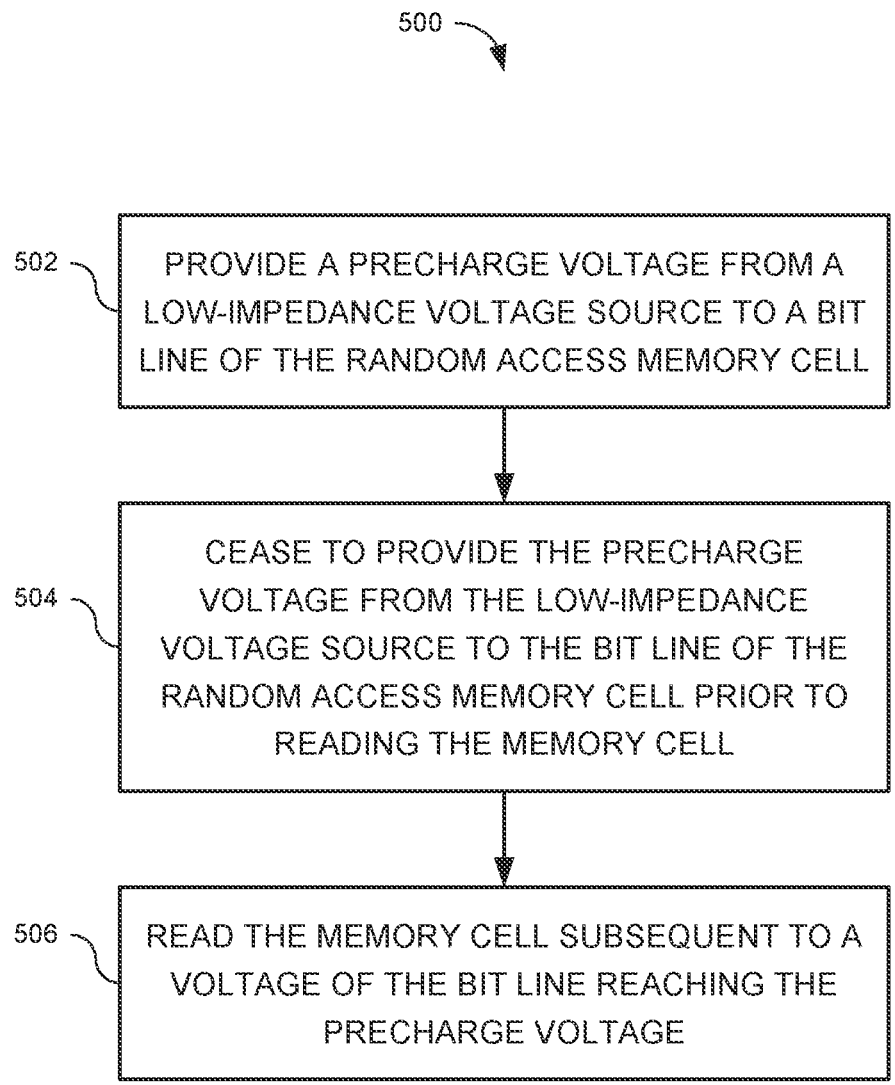
FIG. 5 illustrates a read operation according to some embodiments of the disclosed technology.

FIG. 5 illustrates a read operation 500 according to some embodiments of the disclosed technology. Referring to FIG. 5, the read operation 500 includes providing a precharge voltage from a low-impedance voltage source to a bit line of a random access memory cell, at 502. In the example of FIG. 4, the control circuit 410 controls on/off switch M6 so that the UGA 104C provides the precharge voltage $V_{PRE}$ to the bit line of the RRAM cell 102. One advantage of this approach is that the UGA 104C, being a voltage source, controls the voltage at the bit line of the RRAM cell 502, thereby preventing voltage overshoot and the consequent long lead times and damage to the resistive memory element R. Accordingly, during the precharge phase, the precharge voltage always precharges to the precharge voltage, regardless of process variations or the state of the memory cell. And during the sense phase, the bit line voltage always settles to the precharge voltage, regardless of the state of the memory cell. And being a low-impedance voltage source, UGA 104C provides a large current for rapid pre-charging of the RRAM cell 102. Furthermore, the current flowing through the memory cell never exceeds Vbl/R, where Vbl is the bit line voltage and R is the resistance of the RRAM cell.

Referring again to FIG. 5, the read operation 500 includes ceasing to provide the precharge voltage from the low-impedance voltage source to the bit line of the random access memory cell prior to reading the memory cell, at 504. In the example of FIG. 4, the control circuit 410 controls the on/off switch M6 using a precharge signal PS to electrically decouple the UGA 104C from the bit line of the RRAM cell 102. In some embodiments, the precharge voltage may be applied for a determined interval. Other embodiments may employ other techniques for limiting the duration of the precharge voltage.

Referring again to FIG. 5, the read operation includes reading the memory cells subsequent to the voltage of the bit line reaching the precharge voltage, at 506. In the example of FIG. 4, the RRAM cell 102 may be read at the output terminal Sout, for example, using a sense amplifier.

Figure 6:
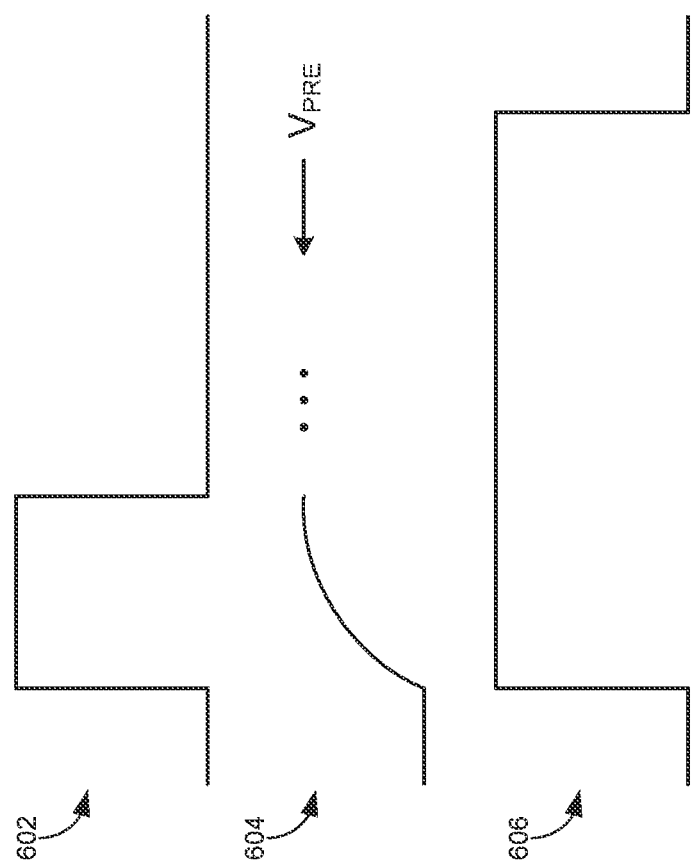
FIG. 6 illustrates a read operation for the memory circuit of FIG. 4 according to some embodiments of the disclosed technology.

FIG. 6 illustrates a read operation for the memory circuit 400 of FIG. 4 according to some embodiments of the disclosed technology. Referring to FIG. 6, the precharge signal PS is illustrated at 602. The bit line voltage is illustrated at 604. A read signal is illustrated at 606.

When the precharge signal is asserted, the bit line voltage begins to rise, as shown at 604. And because the deadline voltage is controlled by a voltage source, the bit line voltage rises rapidly and consistently to the precharge voltage $V_{PRE}$, as shown in FIG. 6, resulting in the advantages described above.

In the disclosed technology, the bit line voltage determines the read times of the memory cell. This provides opportunities for close control of the read times by selecting an appropriate precharge voltage. In some embodiments, the precharge voltage may be selected such that the read time of the memory cells when in the off state is approximately equal to the read time of the memory cells when in the on state. This technique increases the read speed performance of the entire memory array.

Another advantage of the disclosed technology is that the benefits described above persist regardless of the precharge voltage level employed. This advantage is demonstrated in FIGS. 7A through 7D, which illustrate simulation results for memory circuits according to the disclosed technology. In each of these figures, the left-hand scale shows voltage and bolts, while the right-hand scale shows current in microamps.

FIG. 7A illustrates a read operation for a RRAM cell having a resistive memory element in the off state using a precharge voltage of $V_{PRE}$=200 mV. In this example, the resistance of the resistive memory element is approximately Roff=200 Ohms. Referring to FIG. 7A, when the precharge signal PS is asserted, the current Icell flowing through the RRAM cell rises rapidly to approximately one microamp without overshoot. That is, the current never exceeds $V_{PRE}$/Roff, as can be seen in FIG. 7A. Consequently, the bit line voltage Vbl rises quickly and consistently to the precharge voltage $V_{PRE}$ without overshoot. Then, when the precharge signal PS is negated, and because the resistive memory element is off, the current Icell and the voltage Vbl rise, causing an increase in the voltage Vout at the output terminal Sout.

Figure 7B:
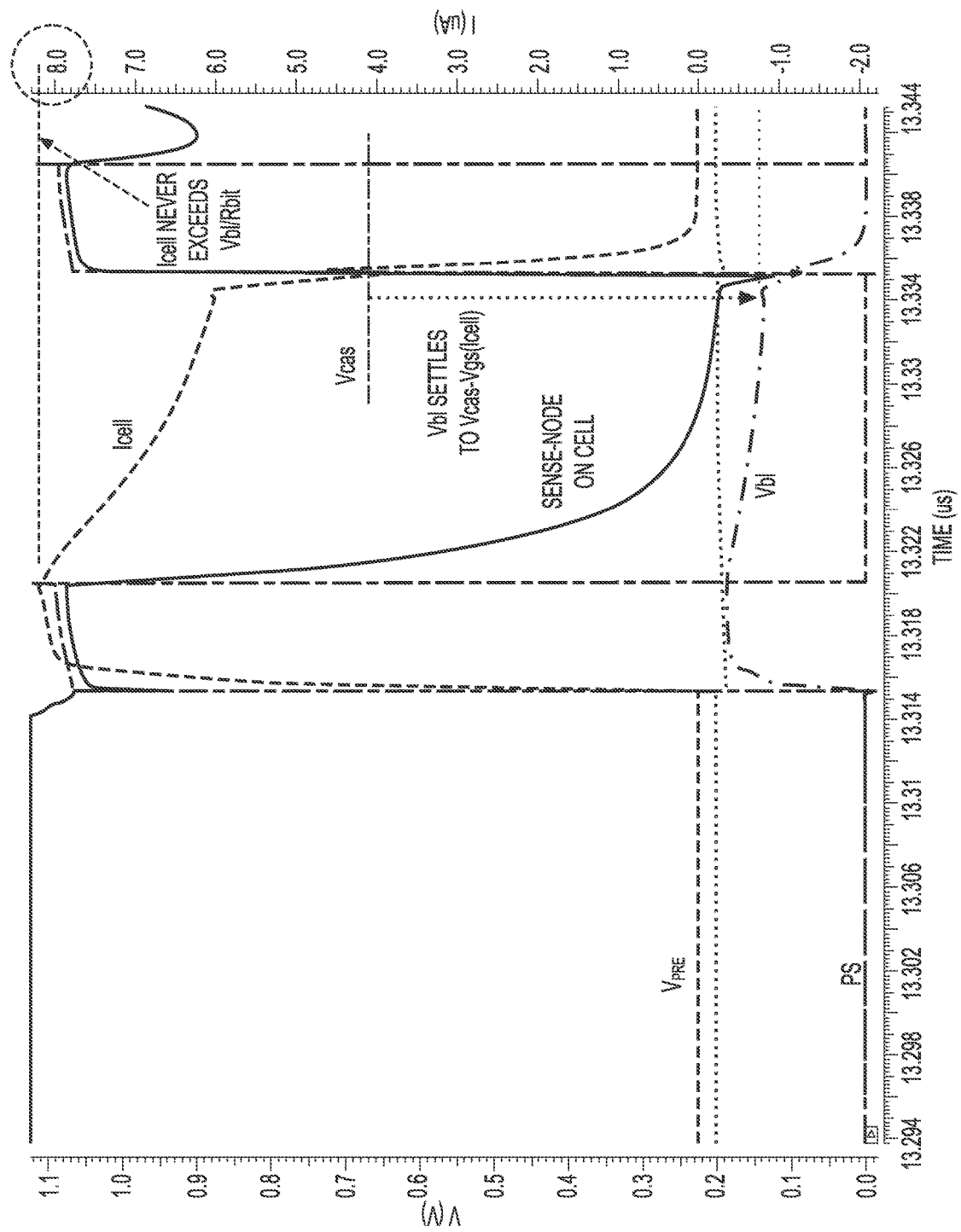
FIG. 7B illustrates a read operation for a RRAM cell having a resistive memory element in the on state using a precharge voltage of VPRE=200 mV.

FIG. 7B illustrates a read operation for a RRAM cell having a resistive memory element in the on state using a precharge voltage of VPRE=200 mV. In this example, the resistance of the resistive memory element is approximately Ron=20 KOhms. Referring to FIG. 7B, when the precharge signal PS is asserted, the current Icell flowing through the RRAM cell rises rapidly to approximately eight microamps without overshoot. That is, the current never exceeds $V_{PRE}$/Ron, as can be seen in FIG. 7B. Consequently, the bit line voltage Vbl rises quickly and consistently to the precharge voltage $V_{PRE}$ without overshoot. Then, when the precharge signal PS is negated, and because the resistive memory element is on, the current Icell and the voltage Vbl fall, causing a decrease in the voltage Vout at the output terminal Sout.

FIG. 7C illustrates a read operation for a RRAM cell having a resistive memory element in the off state using a precharge voltage of $V_{PRE}$=80 mV. In this example, the resistance of the resistive memory element is approximately Roff=200 Ohms. Referring to FIG. 7C, when the precharge signal PS is asserted, the current Icell flowing through the RRAM cell rises rapidly to approximately one microamp without overshoot. That is, the current never exceeds $V_{PRE}$/Roff, as can be seen in FIG. 7C. Consequently, the bit line voltage Vbl rises quickly and consistently to the precharge voltage $V_{PRE}$ without overshoot. Then, when the precharge signal PS is negated, and because the resistive memory element is off, the current Icell and the voltage Vbl rise, causing an increase in the voltage Vout at the output terminal Sout.

Figure 7D:
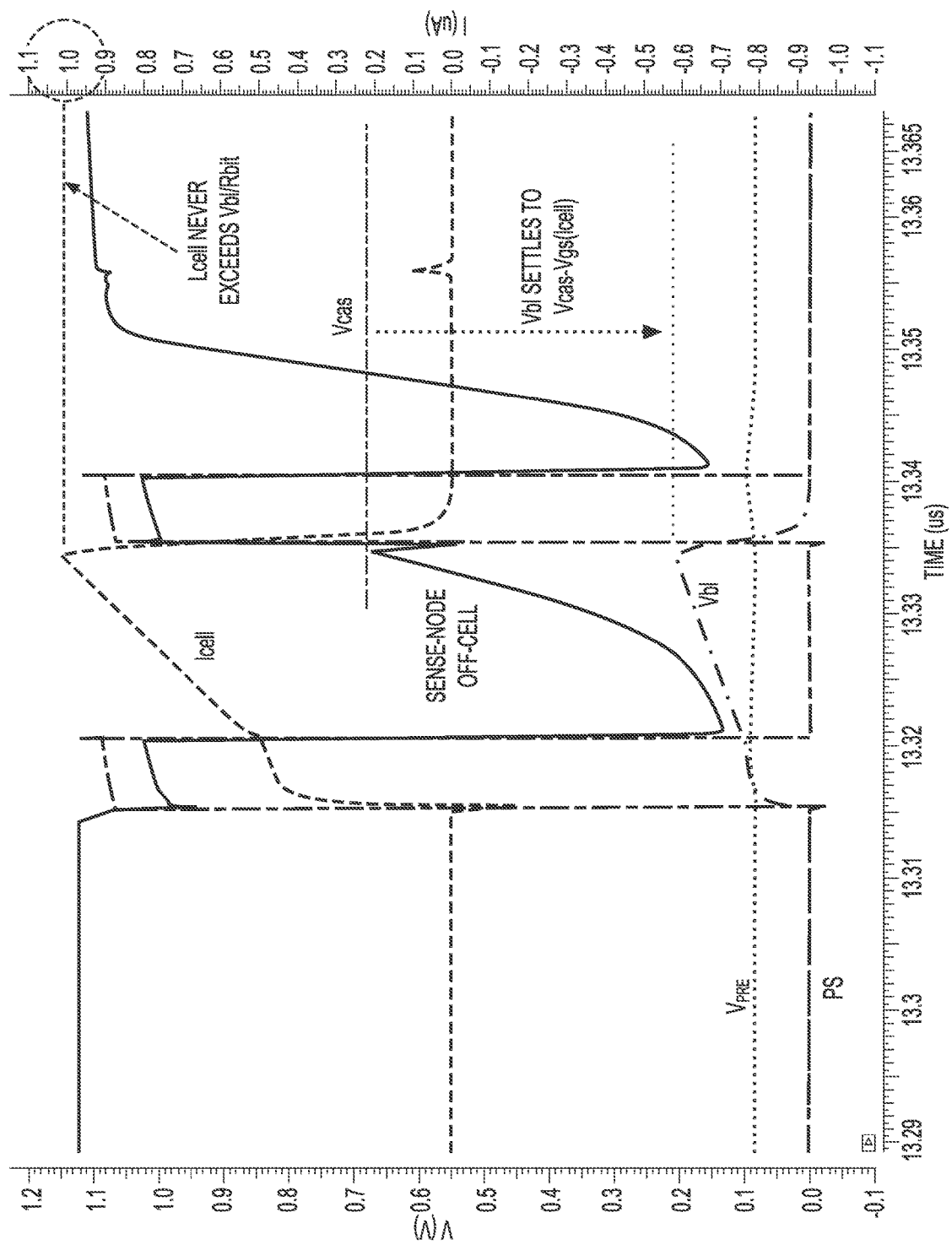
FIG. 7D illustrates a read operation for a RRAM cell having a resistive memory element in the on state using a precharge voltage of VPRE=80 mV.

FIG. 7D illustrates a read operation for a RRAM cell having a resistive memory element in the on state using a precharge voltage of VPRE=80 mV. In this example, the resistance of the resistive memory element is approximately Ron=20 KOhms. Referring to FIG. 7D, when the precharge signal PS is asserted, the current Icell flowing through the RRAM cell rises rapidly to approximately eight microamps without overshoot. That is, the current never exceeds $V_{PRE}$/Ron, as can be seen in FIG. 7D. Consequently, the bit line voltage Vbl rises quickly and consistently to the precharge voltage $V_{PRE}$ without overshoot. Then, when the precharge signal PS is negated, and because the resistive memory element is on, the current Icell and the voltage Vbl fall, causing an decrease in the voltage Vout at the output terminal Sout.

Spatially relative terms such as "under," "below," "lower," "over," "upper," and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising," and the like are open ended terms that indicate the presence of stated elements or features, but do not preclude additional elements or features. The articles "a," "an" and "the" are intended to include the plural as well as the singular, unless the context clearly indicates otherwise.

Although this invention has been disclosed in the context of certain implementations and examples, it will be understood by those skilled in the art that the present invention extends beyond the specifically disclosed implementations to other alternative implementations and/or uses of the invention and obvious modifications and equivalents thereof. Thus, it is intended that the scope of the present invention herein disclosed should not be limited by the particular disclosed implementations described above.

Furthermore, the skilled artisan will recognize the interchangeability of various features from different implementations. In addition to the variations described herein, other known equivalents for each feature can be mixed and matched by one of ordinary skill in this art to construct analogous systems and techniques in accordance with principles of the present invention.

It is to be understood that not necessarily all objects or advantages may be achieved in accordance with any particular implementation of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

What is claimed is:

1. A memory circuit comprising:
an array of random access memory cells;
a low-impedance voltage source configured to provide a precharge voltage; and
a control circuit configured to precharge a bit line of one of the random access memory cells to the precharge voltage using the low-impedance voltage source prior to reading the one of the random access memory cells;
wherein a magnitude of the precharge voltage is selected such that a read time of the resistive random access memory cells when in an off state is approximately equal to a read time of the resistive random access memory cells when in an on state.

2. The memory circuit of claim 1, further comprising:
a on/off switch disposed between the low-impedance voltage source and the bit line of the one of the random access memory cells;
wherein the control circuit is configured to electrically couple the low-impedance voltage source to the bit line until the bit line reaches the precharge voltage, and to electrically decouple the low-impedance voltage source from the bit line prior to reading the one of the random access memory cells.

3. The memory circuit of claim 1, wherein the low-impedance voltage source is a high-gain low-impedance voltage source.

4. The memory circuit of claim 3, wherein the low-impedance voltage source comprises a unity-gain amplifier.

5. The memory circuit of claim 1, wherein the random access memory cells are resistive random access memory cells.

6. The memory circuit of claim 1, wherein each of the resistive random access memory cells comprises:
a three-terminal access element; and
a resistive memory element coupled between the three-terminal access element and one of a plurality of the bit lines.

7. The memory circuit of claim 6, wherein:
a first terminal of the three-terminal access element is coupled to one of a plurality of word lines;
a second terminal of the three-terminal access element is coupled to one of a plurality of source lines; and the resistive memory element is coupled between a third terminal of the three-terminal access element and the one of the plurality of the bit lines.

8. The memory circuit of claim 1, further comprising:
a sense amplifier configured to read the random access memory cells.

9. A method for reading a random access memory cell, the method comprising:
providing a precharge voltage from a low-impedance voltage source to a bit line of the random access memory cell; and
reading the memory cell subsequent to a voltage of the bit line reaching the precharge voltage;
wherein a magnitude of the precharge voltage is selected such that a read time of the resistive random access memory cells when in an off state is approximately equal to a read time of the resistive random access memory cells when in an on state.

10. The method of claim 9, further comprising:
ceasing to provide the precharge voltage from the low-impedance voltage source to the bit line of the random access memory cell prior to reading the memory cell.

11. The method of claim 9, further comprising:
electrically coupling the low-impedance voltage source to the bit line until the bit line reaches the precharge voltage; and
electrically decoupling the low-impedance voltage source from the bit line prior to reading the random access memory cell.

12. The method of claim 9, wherein the voltage source comprises a low-impedance voltage source.

13. The method of claim 12, wherein the low-impedance voltage source comprises a unity-gain amplifier.

14. The method of claim 9, wherein the random access memory cell is a resistive random access memory cell.

15. The method of claim 9, wherein the resistive random access memory cell comprises:
a three-terminal access element; and
a resistive memory element coupled between the three-terminal access element and the bit line.

16. The method of claim 15, wherein:
a first terminal of the three-terminal access element is coupled to a word line;
a second terminal of the three-terminal access element is coupled to a source line; and
the resistive memory element is coupled between a third terminal of the three-terminal access element and the bit line.

17. A memory circuit comprising:
a random access memory cell;
a low-impedance voltage source configured to provide a precharge voltage; and
a control circuit configured to precharge a bit line of the random access memory cell to the precharge voltage using the low-impedance voltage source prior to reading the random access memory cell;
wherein a magnitude of the precharge voltage is selected such that a read time of the resistive random access memory cell when in an off state is approximately equal to a read time of the resistive random access memory cell when in an on state.

18. The memory circuit of claim 17, further comprising:
a on/off switch disposed between the low-impedance voltage source and the bit line of the random access memory cell;
wherein the control circuit is configured to electrically couple the low-impedance voltage source to the bit line until the bit line reaches the precharge voltage, and to electrically decouple the low-impedance voltage source from the bit line prior to reading the random access memory cell.

19. The memory circuit of claim 17, wherein the random access memory cell is a resistive random access memory cell.

20. The memory circuit of claim 17, wherein the resistive random access memory cell comprises:
a three-terminal access element; and
a resistive memory element coupled between the three-terminal access element and the bit line.

* * * * *